United States Patent
Inoue et al.

(10) Patent No.: US 7,056,853 B2
(45) Date of Patent: Jun. 6, 2006

(54) OXIDE CERAMIC MATERIAL, CERAMIC SUBSTRATE EMPLOYING THE SAME, CERAMIC LAMINATE DEVICE, AND POWER AMPLIFIER MODULE

(75) Inventors: Osamu Inoue, Hirakata (JP); Kenji Harada, Sakai (JP); Kojiro Okuyama, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 105 days.

(21) Appl. No.: 10/762,062

(22) Filed: Jan. 21, 2004

(65) Prior Publication Data
US 2004/0151925 A1 Aug. 5, 2004

(30) Foreign Application Priority Data
Feb. 5, 2003 (JP) .............................. 2003-028810

(51) Int. Cl.
*C04B 35/10* (2006.01)
(52) U.S. Cl. ...................... 501/153; 428/633; 428/652; 428/673
(58) Field of Classification Search ................ 501/127, 501/153; 428/633, 652, 673
See application file for complete search history.

(56) References Cited

U.S. PATENT DOCUMENTS

| | | | | |
|---|---|---|---|---|
| 3,862,846 A | * | 1/1975 | Smoak et al. | 501/151 |
| 5,665,127 A | * | 9/1997 | Moltgen et al. | 51/293 |
| 6,610,623 B1 | * | 8/2003 | Alford et al. | 501/153 |

FOREIGN PATENT DOCUMENTS

| | | | |
|---|---|---|---|
| JP | 01210033 A | * | 8/1989 |
| JP | 3-271115 | | 12/1991 |
| JP | 11-157921 | | 6/1999 |

* cited by examiner

*Primary Examiner*—David Sample
(74) *Attorney, Agent, or Firm*—Hamre, Schumann, Mueller & Larson, P.C.

(57) ABSTRACT

An oxide ceramic material is provided to contain aluminum oxide as a principal component, and at least one selected from A and B shown below as an auxiliary component:
  A: niobium oxide and copper oxide
  B: copper oxide, titanium oxide, and silver oxide.
With this, it is possible to provide an oxide ceramic material having sinterability at a low temperature and a high heat conductivity, as well as a ceramic substrate, a ceramic laminate device, and a power amplifier module employing the same.

16 Claims, 1 Drawing Sheet

OXIDE CERAMIC MATERIAL, CERAMIC SUBSTRATE EMPLOYING THE SAME, CERAMIC LAMINATE DEVICE, AND POWER AMPLIFIER MODULE

BACKGROUND OF THE INVENTION

1. Field of the Invention

The present invention relates to an oxide ceramic material containing alumina (aluminum oxide, $Al_2O_3$) as a principal component, a multilayer ceramic substrate employing the same and having a conductive body therein, a ceramic laminate device, and a power amplifier module employing the same.

2. Related Background Art

Multilayer wiring substrates on which semiconductor ICs are mounted are classified roughly into organic substrates mainly made of organic materials such as glass epoxy, and inorganic substrates mainly made of ceramics such as alumina or glass. Inorganic substrates are used widely, which generally are characterized by high heat-resistance property, high heat conductivity, low thermal expansion, low dielectric loss, and high reliability.

The inorganic multilayer substrates are classified roughly into a HTCC (high temperature co-fired ceramics) type and a LTCC (low temperature co-fired ceramics) type. The HTCC type is formed using $Al_2O_3$, AlN, BeO, SiC—BeO, etc. as a base material. These ceramic materials are manufactured by molding a raw material in powder form and thereafter sintering the same at a high temperature of 1500° C. or above. Therefore, as a material for a conductive body formed in a multilayer substrate, Mo or W having a high melting point is used, but Mo and W have a defect of a high resistivity as a conductive body. On the other hand, Ag and Cu having low resistivities have low melting points and hence are molten in sintering at a high temperature. Therefore they cannot be used as a wiring conductive body for use in a HTCC type substrate. Further, the sintering temperature of 1500° C. or above is a significant loss of energy.

Then, a substrate is provided by modifying a ceramic material such as alumina so as to have the sinterability at a low temperature at which Ag or Cu is not molten; namely, the LTCC type substrate. The LTCC type substrate is made of a ceramic material modified by mixing a large amount of a glass material of a low melting point therein at a ratio of about 50 wt % so that the sinterability at low temperature is achieved, and examples of the material compositions include, for instance, borosilicate lead glass+alumina, borosilicate glass+cordierite, and other various compositions. These can be sintered at a temperature of 1000° C. or below, and therefore, they can employ Ag or Cu having a low resistivity as internal conductive body. Therefore, as the inorganic multilayer substrate, the LTCC type has been used mainly, as compared with the HTCC type. The LTCC material allows capacitors, inductors, and the like to be formed therein easily, and is also used as a ceramic laminate device having a function beyond the function as a mere wiring substrate. However, the LTCC material containing a large amount of such glass loses excellent characteristics such as high heat conductivity and high mechanical strength that alumina originally possesses, since glass has low heat conductivity and low mechanical strength.

When the heat conductivity of the substrate decreases, in the case where a heat-radiating element such as a power amplifier is mounted, a considerable temperature rise occurs due to low heat radiation, thereby causing the element to become unusable. This tendency is remarkable particularly in portable machines that are required to be downsized. To solve this problem, a scheme for forming vias for heat radiation made of a metal conductive body, that is so-called thermal vias, in a portion of the LTCC material below the element mounted is used. However, as a mounting density increases with further downsizing, the provision of thermal vias decreases the freedom in designing, thus hindering the downsizing.

As alumina-based materials whose sintering temperatures are decreased without the use of glass, an alloy of aluminum and bismuth formed in an amorphous state by rapid cooling and subsequent oxidation (refer to the patent document 1 below) and a material obtained by adding manganese oxide and vanadium oxide together to alumina (refer to the patent document 2 below) are disclosed.

Patent document 1: JP 3(1991)-271115 A

Patent document 2: JP 11(1999)-157921 A

However, there are the following problems. An amorphous oxide obtained by oxidizing the alloy of aluminum and bismuth after rapidly cooling the same takes a specific form such that bismuth is dissolved in a solid solution form in alumina, or a specific form such that bismuth as an essential component as well as another elements are dissolved in a solid solution form in alumina. Besides, as for the manufacturing method, they cannot be prepared by a normal ceramics process of only mixing material powders, and molding and sintering the same, and the molding of the same requires simultaneous application of temperature and pressure. Therefore, the method of manufacturing the same is not suitable for mass production. On the other hand, a material obtained by adding manganese oxide and vanadium to alumina involves environmental problems since the added materials are toxic substances and added amounts thereof are several percents, which are not small amounts. Still further, since the reactivity of vanadium oxide with silver is high, when the internal conductive body is silver, the materials tend to cause reaction upon sintering.

SUMMARY OF THE INVENTION

Therefore, with the foregoing in mind, it is an object of the present invention to provide an oxide ceramic material that contains alumina at a high content and is sintered at a low temperature, and that can be formed using a process of only mixing crystalline oxide powders or metals, and molding and sintering the same without being processed through a complex process and taking a specific form and without using additives easily reactive with a toxic substance or a silver conductive body. It also is an object of the present invention to provide a ceramic substrate, a ceramic laminate device, and a power amplifier module employing the same.

An oxide ceramic material of the present invention is characterized by containing aluminum oxide as a principal component, and at least one selected from A and B shown below as an auxiliary component:

A: niobium oxide and copper oxide

B: copper oxide, titanium oxide, and silver oxide.

A ceramic substrate or a ceramic laminate device of the present invention is characterized by including, at least in its internal layer:

an insulation layer made of an oxide ceramic material, the oxide ceramic material containing aluminum oxide as a principal component, and at least one selected from at least A and B shown below as an auxiliary component:

A: niobium oxide and copper oxide

B: copper oxide, titanium oxide, and silver oxide; and
a conductive body containing silver as a principal component.

A power amplifier module of the present invention is characterized by including a ceramic substrate or a ceramic laminate device, and a power amplifier element mounted thereon, wherein the ceramic substrate or the ceramic laminate device includes, at least in its internal layer:

an insulation layer made of an oxide ceramic material, the oxide ceramic material containing aluminum oxide as a principal component, and at least one selected from at least A and B shown below as an auxiliary component:
A: niobium oxide and copper oxide
B: copper oxide, titanium oxide, and silver oxide; and
a conductive body containing silver as a principal component.

DETAILED DESCRIPTION OF THE INVENTION

Figure 1:
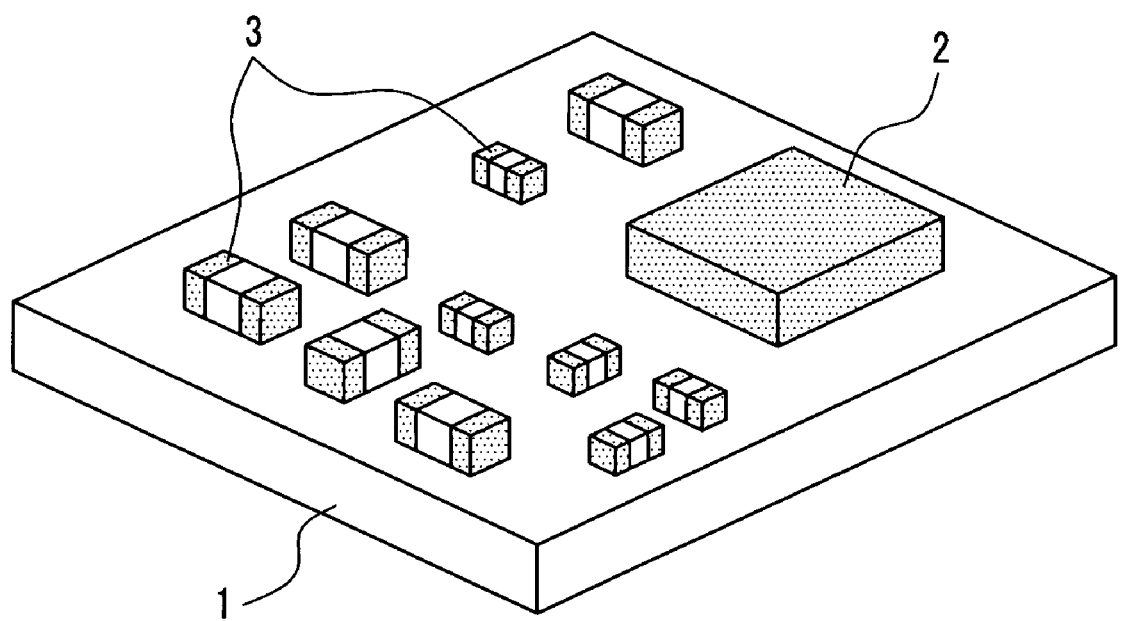
FIG. 1 is a perspective view illustrating a power amplifier module employing a ceramic wiring substrate according to an embodiment of the present invention.
1: ceramic multilayer wiring substrate
2: power amplifier
3: electronic component such as capacitor, inductor, resistor, etc.

The following will describe embodiments of the present invention in detail.

The present invention relates to a ceramic material having a characteristic composition. A principal component of the composition is alumina, and by also providing a plurality of specific metal oxides as auxiliary components, the composition obtains characteristics of low-temperature sinterability and high heat conductivity, which the conventional materials do not possess. Further, since the material of the present invention has sinterability at a low temperature, Ag having a low electric resistivity can be used as the internal conductive body, and a LTCC with a high heat conductivity can be obtained. More specifically, at least niobium oxide and copper oxide can be contained as auxiliary components.

In the present invention, it is preferable that a content of the principal component in the entirety of the oxides is not less than 80 mass percent (mass %) and not more than 98 mass %, and in the case where all the rest of the components are the foregoing auxiliary components, a content of the auxiliary components is not less than 2 mass % and not more than 20 mass %. In the case where other third components are contained in addition to the foregoing auxiliary components, a content of a sum of the auxiliary components and the third components preferably is not less than 2 mass % and not more than 20 mass %.

In the case where the auxiliary components are those of A, assuming an entirety of a sum of the auxiliary components is 100 mass %, percentages of niobium and copper oxide preferably are in the following ranges, respectively:

40 mass % $\leq$ niobium oxide $\leq$ 70 mass %
30 mass % $\leq$ copper oxide $\leq$ 60 mass %

In the case where the auxiliary components are those of A, at least one selected from titanium oxide, silver oxide, and bismuth oxide preferably is contained additionally. Particularly, titanium oxide and silver oxide desirably are contained together.

Still further, assuming that the entirety of the sum of the auxiliary components is 100 mass %, percentages of niobium oxide, copper oxide, titanium oxide, silver oxide, and bismuth oxide composing the foregoing auxiliary components preferably are in the following ranges:

30 mass % $\leq$ niobium oxide $\leq$ 70 mass %
10 mass % $\leq$ copper oxide $\leq$ 60 mass %;
0 mass % $\leq$ titanium oxide $\leq$ 30 mass %;
0 mass % $\leq$ silver oxide $\leq$ 30 mass %;
0 mass % $\leq$ bismuth oxide $\leq$ 40 mass %.

Still further, in the case of the oxide ceramic material containing aluminum oxide as a principal component as well as at least copper oxide, titanium oxide and silver oxide as auxiliary components, assuming an entirety of a sum of the auxiliary components is 100 mass %, percentages of copper oxide, titanium oxide, and silver oxide composing the foregoing auxiliary components preferably are in the following ranges, respectively:

10 mass % $\leq$ copper oxide $\leq$ 90 mass %;
5 mass % $\leq$ titanium oxide $\leq$ 60 mass %;
5 mass % $\leq$ silver oxide $\leq$ 40 mass %.

Still further, a content of aluminum oxide in the entirety of the oxides preferably is not less than 80 mass % and not more than 98 mass %.

Still further, 0.1 mass % to 2.0 mass % of manganese oxide with respect to the entirety of the oxides as 100 mass % is contained preferably.

The oxide ceramic material preferably is sintered so as to have a relative density of not less than 90%.

The oxide ceramic material preferably has a heat conductivity of not less than 5 W/m·k, more preferably, not less than 10 W/m·k.

The oxide ceramic material preferably has a dielectric loss at 1 MHz of not more than 0.05, and more preferably, not more than 0.01.

The oxide ceramic material preferably is obtained by mixing particles of either a metal material or a metal oxide material, molding the same, and sintering the same at a temperature of not higher than 950° C. Further, the oxide ceramic material may be obtained by mixing particles of either a metal material or a metal oxide material, then calcining and pulverizing the same, and thereafter, molding the same, and sintering the same at a temperature of not higher than 950° C. As described above, the present invention does not require any step of preparing a melt, and hence, reduces the manufacturing cost.

The following will describe a material of the present invention and a method for preparing a LTCC employing the same. The method described below is a mere example of a normal preparing method, and the present invention is not limited to this. It is possible to make appropriate changes within a normal ceramic preparation process. Powders of alumina (aluminum oxide, $Al_2O_3$) and various types of metal oxides are mixed well using a mixer such as a ball mill. Though various type of balls can be used in the ball mill, alumina balls are desirable since the use of the same minimizes mixed amounts of unnecessary impurities. A medium used for mixing may be an organic solvent, but normally water may be used. Further, to improve the homogeneity upon mixing and the moldability, the mixture powder is calcined, and thereafter the pulverization of the same may be carried out again by a ball mill or the like.

It should be noted that normally a metal oxide may be used as a material powder, but in the case where it is sintered in the presence of oxygen, for instance, in air, a metallic silver powder or a metallic copper powder may be used as a part of the material, particularly as silver oxide or copper oxide.

A small amount of an organic binder for molding such as polyvinyl alcohol is mixed in the mixture powder thus obtained, and the mixture is passed through a mesh so as to be granulated. The granulated powder is put in a die of an appropriate size and molded by pressing, and a molded body is obtained.

In the same mixture powder, an organic binder and a solvent for sheet molding are mixed and kneaded sufficiently so that a slurry is prepared, and the slurry is spread on a base film so as to be molded in a sheet form. Thereafter, the sheet is dried so that a green sheet is obtained. Here, it is possible to carry out the mixing of alumina with various metal oxide powders and the mixing of the organic binder and the solvent through one process.

On the other hand, a conductive metal powder and an organic vehicle component composed of an organic binder and a solvent are mixed and kneaded sufficiently so that a conductive paste for internal layer wiring is prepared. Likewise, a conductive paste for vias is prepared with the same composition, or alternatively, with a composition with a slightly different composition ratio. It is possible to add a small amount of the above-described mixture powder of alumina and metal oxides to the paste composition. By so doing, the fitting of the electrodes with the substrate in a laminate finally obtained is improved.

Next, via holes are formed in the green sheet thus prepared. Thereafter, the conductive paste for vias is filled in the via holes in the green sheet. Then, a wiring pattern is printed on the green sheet using the conductive paste for internal layer wiring, and thereafter such green sheets thus formed are laminated so that a laminate is formed.

A molded body of the present invention containing the oxides as a principal component, and the green sheet laminate, which are prepared in the above-described manner, are subjected to a binder removing process at a temperature of approximately 600° C. in a furnace, and thereafter, they are sintered further at a predetermined temperature. Consequently, a sintered body and a multilayer substrate are obtained.

As the alumina powder used as a material, one with any particle diameter can be used as long as the powder is not extremely coarse, but the particle diameter preferably is small so that it has a high density at a low temperature, desirably not more than 1 μm. On the other hand, considering the case where the powder is to be molded, the particle diameter preferably is not less than 0.1 μm since a powder with an extremely small diameter is difficult to handle. The particle diameters of the added materials other than alumina may be slightly greater than that.

Even if a metal oxide other than the foregoing is mixed therein as a raw material for the material of the present invention, there does not arise any particular problem as long as an amount of the same is sufficiently small. It is considered that such mixing of a substance occurs unavoidably in a starting material, or from a medium used during mixing, or due to addition of the same for the purpose of subtle adjustment of characteristics of the material of the present invention. However, an increase in the amount of the same is not desirable since it possibly causes the decreased degree of sintering, the degradation of dielectric properties, and the deterioration of heat conductivity.

A conductive body used in the multilayer substrate of the present invention is not limited particularly, but to make the full use of the characteristic of sinterability at a low temperature, it is desirable that the conductive body contains copper or silver having a low resistivity as a principal component. In the case where copper is used for the internal conductive body, it is necessary to set the sintering temperature at about 1070° C. so that it is lower than the melting point of copper, that is, about 1080° C. In the case where silver is used for the internal conductive body, it is necessary to set the sintering temperature at about 950° C. so that it is lower than the melting point of silver, that is, about 960° C. In the present invention, either of the foregoing two can be used as the internal conductive body, but the use of silver is preferable since it can be subjected to the binder removing process in air.

The methods for preparing the molded body and the green sheets are not limited particularly, and for instance, the uniaxial molding, the isotropic-pressure pressing, the doctor blade method, the calendering, the roll coater method, etc. can be used.

As a base film for protecting the sheet, a polyethylene-based resin, a polyester-based resin, paper, etc. can be used. Further, as a method for forming vias in an insulation sheet, punching or laser processing can be used.

As an atmosphere for sintering a molded body and a laminate, the atmospheric gas may be used normally, since Ag can be used as the internal conductive body.

In the present invention, alumina powder and a specific oxide powder are mixed, which can be sintered at a temperature significantly lower than the temperature of sintering alumina normally. This is particularly advantageous concerning the manufacturing energy and the cost of a furnace used in the manufacture. Further, since the mixture can be sintered at a temperature not higher than 950° C., Ag having a low resistivity can be used as a conductive body, and the mixture and Ag can be sintered together. The sintered body of the oxide ceramic material of the present invention is, as described above, subjected to only mixing metal oxides mechanically, and molding and heating the same at a relatively low temperature. Therefore, the sintered body possibly has a phase configuration such that small amounts of the metal oxide components form a solid solution together, but basically it is a mixture of metal oxides or chemical compounds resulting from mutual reaction of two or more of the metal oxides. It has a primary phase of alumina (aluminum oxide, $Al_2O_3$) since the content of alumina is large, but it is a mixture body containing oxides other than alumina also. Since the primary phase of the mixture body is that of alumina though phases of small amounts of substances other than alumina are mixed therein, the heat conductivity is high. Therefore, when it is used in a multilayer substrate or the like, even if a heat-emitting element such as a power amplifier is mounted thereon or therein, the heat is radiated via the substrate, and the vicinity of the element is not heated to an excessively high temperature. Since it has a high heat conductivity, there is no need to provide thermal vias specifically. Further, in the case where thermal vias are used in combination, the heat radiation is improved further. Moreover, since it has an excellent dielectric property also, it can be used as a module on which an element other than a power amplifier is mounted. Still further, it also has a mechanical strength at the same level as that of normal alumina, which is high, except in the case where it is used at a high temperature.

FIG. 1 is a perspective view illustrating an example of a power amplifier module in which a ceramic wiring substrate is used. More specifically, a power amplifier 2, and an electronic component 3 such as a capacitor, an inductor, a resistor or the like are mounted on a ceramic multilayer wiring substrate 1. The power amplifier module preferably is incorporated in, for instance, a motherboard of a mobile telephone.

As described above, the present invention is a ceramic material containing aluminum oxide and a specific metal oxide, and can be sintered at a temperature considerably lower than conventionally. Therefore, the present invention reduces the energy cost, and eases the restrictions on a furnace used. Further, since the content of aluminum oxide is large, it exhibits properties similar to the original properties of alumina, and therefore, it can be used as an alternative to alumina.

In the case where this material is used for forming a ceramic substrate, since it can be sintered at a temperature not higher than 950° C., it can be configured so as to include therein a conductive body containing silver having a low resistivity as a principal component. Therefore, it can be used as LTCC. Further, since it has a high heat conductivity, it ensures controlling the temperature rise, even if it is formed as a module on which a heat-radiating element such as a power amplifier is mounted.

EXAMPLES

The following will describe the present invention more specifically, while referring to examples.

(1) Method for Determining Heat Conductivity

The heat conductivity of a sample was measured using so-called laser flashing in which one side of a sample in a disk form is irradiated with a laser beam and a heat conductivity is determined by measuring a temperature rise on a surface on the opposite side.

(2) Method for Determining a Dielectric Loss

A dielectric loss of a sample was determined by forming gold electrodes by sputtering on both sides of a sample in a disk form and measuring a dielectric loss using a LCR meter 4284A manufactured by Hewlett Packard at 1 MHz.

Example 1

As starting materials, an aluminum oxide ($Al_2O_3$) powder with a purity of 99.99% and a particle diameter of 0.5 μm, and powders of various metal oxides with purities at reagent levels or above were used. These were weighed for each sample so that a composition shown in Table 1 was obtained and a sum of their masses was 200 g, and they were subjected to wet mixing by a ball mill employing alumina balls for 12 hours. After the powder obtained was dried, a small amount of polyvinyl alcohol aqueous solution was mixed, and the mixture was passed through a 32-mesh sieve so as to be granulated. This powder was molded in a die with a pressure of 1 t/cm$^2$ being applied thereto uniaxially, so as to have a diameter of 12 mm and a thickness of approximately 1 mm. The molded body obtained was heated at 500° C. in air for one hour for removing a binder, and thereafter, it was sintered at 900° C. to 1000° C. for one hour. The size and mass of the sintered body were measured so that a sintered density was calculated.

Further, a plurality of the same sintered bodies were prepared, and were pulverized and a true density was measured using a pycnometer, so that a relative sintered density was derived from the quotient of the sintered density divided by the true density. The results are shown in Table 1.

TABLE 1

| Sample No. | Composition (mass %) | | | | | | Sintering Temp. (° C.) | | | Ex./ Comp. Ex. |
|---|---|---|---|---|---|---|---|---|---|---|
| | $Al_2O_3$ | $Nb_2O_5$ | CuO | $TiO_2$ | $Ag_2O$ | $Bi_2O_3$ | 900 | 950 | 1000 | |
| 1 | 100 | | | | | | 55.0 | 55.2 | 57.5 | Comp. Ex. |
| 2 | 90 | 10 | | | | | 55.1 | 55.3 | 57.0 | Comp. Ex. |
| 3 | 90 | | 10 | | | | 55.2 | 55.3 | 57.7 | Comp. Ex. |
| 4 | 90 | | | 10 | | | 55.1 | 55.2 | 57.5 | Comp. Ex. |
| 5 | 90 | | | | 10 | | 54.9 | 55.2 | 56.9 | Comp. Ex. |
| 6 | 90 | | | | | 10 | 55.2 | 55.4 | 57.4 | Comp. Ex. |
| 7 | 90 | 5 | 5 | | | | 68.8 | 92.7 | 99.8 | Ex. |
| 8 | 90 | 5 | | 5 | | | 55.0 | 55.9 | 57.3 | Comp. Ex. |
| 9 | 90 | 5 | | | 5 | | 54.8 | 55.7 | 58.8 | Comp. Ex. |
| 10 | 90 | 5 | | | | 5 | 55.2 | 56.8 | 60.0 | Comp. Ex. |
| 11 | 90 | | 5 | 5 | | | 65.5 | 74.3 | 88.3 | Comp. Ex. |
| 12 | 90 | | 5 | | 5 | | 56.3 | 56.9 | 57.5 | Comp. Ex. |
| 13 | 90 | | 5 | | | 5 | 59.4 | 65.6 | 78.3 | Comp. Ex. |
| 14 | 90 | | | 5 | 5 | | 55.3 | 57.0 | 58.4 | Comp. Ex. |
| 15 | 90 | | | 5 | | 5 | 55.9 | 57.0 | 60.3 | Comp. Ex. |
| 16 | 90 | | | | 5 | 5 | 55.7 | 56.5 | 59.1 | Comp. Ex. |
| 17 | 90 | 4 | 4 | 2 | | | 79.8 | 97.0 | 99.5 | Ex. |
| 18 | 90 | 4 | 4 | | 2 | | 87.3 | 95.8 | 97.3 | Ex. |
| 19 | 90 | 4 | 4 | | | 2 | 75.7 | 95.0 | 96.9 | Ex. |
| 20 | 90 | 4 | | 2 | 4 | | 58.0 | 59.7 | 62.1 | Comp. Ex. |
| 21 | 90 | 4 | | 2 | | 4 | 57.4 | 59.4 | 61.6 | Comp. Ex. |
| 22 | 90 | 4 | | | 2 | 4 | 56.1 | 58.4 | 60.8 | Comp. Ex. |
| 23 | 90 | | 4 | 2 | 4 | | 83.8 | 92.8 | 96.5 | Ex. |
| 24 | 90 | | 4 | 2 | | 4 | 67.0 | 78.8 | 88.0 | Comp. Ex. |
| 25 | 90 | | 4 | | 2 | 4 | 57.5 | 58.2 | 61.4 | Comp. Ex. |
| 26 | 90 | | | 2 | 4 | 4 | 56.2 | 57.5 | 59.6 | Comp. Ex. |
| 27 | 90 | 4 | 3 | 1 | 2 | | 97.8 | 99.4 | 99.8 | Ex. |
| 28 | 90 | 4 | 3 | 1 | | 2 | 85.3 | 98.2 | 99.6 | Ex. |
| 29 | 90 | 4 | 3 | | 1 | 2 | 84.6 | 97.3 | 99.5 | Ex. |
| 30 | 90 | 4 | | 1 | 2 | 3 | 59.0 | 61.5 | 63.7 | Comp. Ex. |
| 31 | 90 | | 3 | 1 | 2 | 4 | 84.3 | 92.5 | 97.0 | Ex. |

Note:
"Ex." indicates "Example", and
"Comp. Ex." indicates "Comparative Example".

As seen in Table 1, Sample No. 1 in which alumina was used alone, and Samples No. 2 to No. 6 in each of which only one of various additives was used were not sintered substantially at all at a sintering temperature up to 1000° C.

In the case where two types of additives were used in combination, Sample No. 7 in which $Nb_2O_5$ and CuO were used in combination was sintered considerably even at 950° C. and had a density exceeding 90%, and was sintered at 1000° C. to have a density near a logical density. An effect of acceleration of sintering was observed in Sample No. 11 in which CuO and $TiO_2$ were added and in Sample No. 13 in which CuO and $Bi_2O_3$ were used, but the density did not reach 90% in each case even when they were sintered at 1000° C., and an effect at a level of that of Sample No. 7 was not achieved. Assuming that silver is used for forming internal electrodes, the upper limit of the sintering temperature was about 950° C., and it is considered that a mechanical strength will become insufficient in the case where the relative density is not higher than 90%. Therefore, Samples No. 11 and No. 13 are not practical.

In the case where three types of additives were used in combination, Samples No. 17, No. 18, and No. 19 in each of which one selected from $TiO_2$, $Ag_2O$, and $Bi_2O_3$ was added further in addition to $Nb_2O_5$ and CuO, which were additives that exhibited an effect among the cases of addition of two additives, were sintered even at 950° C. to have a density exceeding 95%, which indicates that they had sinterability at a lower temperature. Further, in the case where $Nb_2O_5$ and CuO were not contained, Sample No. 23 with addition of CuO—$TiO_2$—$Ag_2O$ had a density exceeding 90% as a result of sintering at 950° C. However, neither of the samples with other combinations of additives in the foregoing case had a density reaching 90% even as a result of sintering at 1000° C.

Among the cases where four types of additives were used in combination, Sample No. 27 in which $TiO_2$ and $Ag_2O$ were added further together in addition to $Nb_2O_5$ and CuO had a density exceeding 95% as a result of sintering at 900° C.

As described above, even with the same content of alumina, the sinterability at a lower temperature was achieved by including $Nb_2O_5$ and CuO together, by containing one selected from $TiO_2$, $Ag_2O$, and $Bi_2O_3$ further in addition to $Nb_2O_5$ and CuO, or by containing $Nb_2O_5$, CuO, $TiO_2$, and $Ag_2O$ together. Further, the sinterability at a low temperature was achieved by containing CuO, $TiO_2$, and $Ag_2O$ together. Among these, Sample No. 27 containing $Nb_2O_5$, CuO, $TiO_2$, and $Ag_2O$ together had the excellent sinterability at the lowest temperature.

Example 2

As in Example 1, powders of aluminum oxide, niobium oxide, copper oxide, titanium oxide, silver oxide, and bismuth oxide were prepared, and they were mixed so that, as to each sample, aluminum oxide accounted for 93 mass % while a sum of the other five components was 7 mass %, in which niobium oxide, copper oxide, titanium oxide, silver oxide, and bismuth oxide had mass percentages shown in Table 2 relative to their sum assumed to be 100 mass %. The mixture was sintered at 900° C. or 950° C. for 2 hours so that sintered bodies were prepared, and their relative densities were measured.

Further, on upper and lower surfaces of each of the sintered body samples having relative densities exceeding 90%, gold electrodes were formed by sputtering, and dielectric characteristics were evaluated. The results are shown in Table 2.

TABLE 2

| No. | Ratio by Mass of Auxiliary Components | | | | | Relative Density (%) | | Dielectric Loss (1 MHz) | |
|---|---|---|---|---|---|---|---|---|---|
| | $Nb_2O_5$ | CuO | $TiO_2$ | $Ag_2O$ | $Bi_2O_3$ | 900° C. | 950° C. | 900° C. | 950° C. |
| 1 | 80 | 20 | | | | 63.8 | 88.4 | — | 0.12 |
| 2 | 70 | 30 | | | | 65.9 | 91.3 | — | 0.05 |
| 3 | 60 | 40 | | | | 68.5 | 91.5 | — | 0.04 |
| 4 | 50 | 50 | | | | 68.1 | 91.0 | — | 0.05 |
| 5 | 40 | 60 | | | | 67.4 | 90.7 | — | 0.05 |
| 6 | 30 | 70 | | | | 66.2 | 87.8 | — | 0.24 |
| 7 | 65 | 30 | 5 | | | 75.3 | 95.1 | — | 0.03 |
| 8 | 60 | 30 | 10 | | | 77.9 | 96.3 | — | 0.02 |
| 9 | 50 | 30 | 20 | | | 78.8 | 96.5 | — | 0.02 |
| 10 | 40 | 30 | 30 | | | 76.6 | 96.0 | — | 0.02 |
| 11 | 30 | 30 | 40 | | | 71.1 | 90.2 | — | 0.09 |
| 12 | 65 | 30 | | 5 | | 73.2 | 93.6 | — | 0.03 |
| 13 | 60 | 30 | | 10 | | 82.3 | 94.9 | — | 0.02 |
| 14 | 40 | 30 | | 30 | | 86.1 | 96.8 | — | 0.05 |
| 15 | 30 | 30 | | 40 | | 88.4 | 97.9 | — | 0.33 |
| 16 | 60 | 30 | | | 10 | 70.5 | 93.0 | — | 0.05 |
| 17 | 50 | 30 | | | 20 | 73.2 | 94.4 | — | 0.04 |
| 18 | 30 | 30 | | | 40 | 75.1 | 95.0 | — | 0.05 |
| 19 | 30 | 20 | | | 50 | 74.7 | 93.2 | — | 0.29 |
| 20 | 65 | 20 | 10 | 5 | | 96.2 | 99.0 | 0.02 | 0.009 |
| 21 | 60 | 20 | 10 | 10 | | 96.5 | 99.2 | 0.007 | 0.005 |
| 22 | 40 | 20 | 10 | 30 | | 97.0 | 99.3 | 0.009 | 0.007 |
| 23 | 30 | 20 | 10 | 40 | | 98.3 | 99.5 | 0.15 | 0.12 |
| 24 | 40 | 10 | 30 | 20 | | 94.1 | 98.7 | 0.02 | 0.01 |
| 25 | 60 | 20 | 40 | 20 | | 90.4 | 96.3 | 0.11 | 0.09 |
| 26 | 60 | 20 | 10 | | 10 | 83.5 | 96.8 | — | 0.01 |
| 27 | 60 | 20 | | 10 | 10 | 82.4 | 95.9 | — | 0.05 |
| 28 | 50 | 20 | 10 | 10 | 10 | 95.6 | 98.6 | 0.03 | 0.01 |

As seen in Table 2, when only $Nb_2O_5$ and CuO were included, in both the case where an excessive amount of $Nb_2O_5$ was contained and the case where an excessive amount of CuO was contained, the sintered density decreased slightly, and even if a density of not less than 90% was obtained, a dielectric loss exceeded 5%. Therefore, $Nb_2O_5$ preferably is not more than 70 mass %, and CuO preferably is not more than 60% (Samples No. 1 to No. 6).

Though a higher density was achieved at a lower temperature by adding one selected from $TiO_2$, $Ag_2O$, and $Bi_2O_3$ further in addition to $Nb_2O_5$ and CuO, an excessively increased added amount in turn decreased the density and increased the dielectric loss. Consequently, $TiO_2$ desirably was not less than 30 mass % (Samples No. 7 to No. 11), $Ag_2O$ desirably was not more than 30 mass % (Samples No. 12 to No. 15), and $Bi_2O_3$ desirably was not more than 40 mass % (Samples No. 16 to No. 19). It should be noted that among $TiO_2$, $Ag_2O$, and $Bi_2O_3$, $Ag_2O$ had the greatest effect of increasing the density, $TiO_2$ had the next greatest effect, and $Bi_2O_3$ had the smallest effect.

Further, by adding $TiO_2$ and $Ag_2O$ together further in addition to $Nb_2O_5$ and CuO, the highest density and the lowest dielectric loss were obtained. However, the addition of $TiO_2$ and $Bi_2O_3$ together and the addition of $Ag_2O$ and $Bi_2O_3$ together did not exhibit a significant difference from the addition of one of the same alone.

Example 3

As in Examples 2, powders of aluminum oxide, copper oxide, titanium oxide, and silver oxide were prepared, and they were mixed so that, as to each sample, aluminum oxide accounted for 93 mass %, while a sum of the other three components was 7 mass % in which copper oxide, titanium oxide, and silver oxide had mass percentages shown in Table 3 relative to their sum assumed to be 100 mass %. The mixtures were sintered at 950° C. for 2 hours so that sintered bodies were prepared, and their relative densities were measured.

Further, on upper and lower surfaces of each of the sintered body samples having relative densities exceeding 90%, gold electrodes were formed by sputtering, and dielectric characteristics were evaluated. The results are shown in Table 3.

TABLE 3

| No. | Ratio by Mass | | | Density (%) | Dielectric Loss |
|---|---|---|---|---|---|
| | CuO | $TiO_2$ | $Ag_2O$ | | |
| 1 | 90 | 10 | | 73.3 | — |
| 2 | 90 | 5 | 5 | 90.1 | 0.05 |
| 3 | 90 | | 10 | 55.5 | — |
| 4 | 75 | 20 | 5 | 91.6 | 0.05 |
| 5 | 75 | 20 | 30 | 93.5 | 0.03 |
| 6 | 75 | 10 | 40 | 92.4 | 0.05 |

TABLE 3-continued

| No. | Ratio by Mass | | | Density (%) | Dielectric Loss |
|---|---|---|---|---|---|
| | CuO | $TiO_2$ | $Ag_2O$ | | |
| 7 | 55 | 45 | | 74.0 | — |
| 8 | 55 | 40 | 5 | 92.6 | 0.04 |
| 9 | 55 | 30 | 15 | 94.3 | 0.03 |
| 10 | 55 | 20 | 25 | 95.0 | 0.02 |
| 11 | 55 | 10 | 35 | 94.4 | 0.03 |
| 12 | 55 | 5 | 40 | 92.9 | 0.04 |
| 13 | 55 | | 45 | 55.7 | — |
| 14 | 35 | 65 | | 73.5 | — |
| 15 | 35 | 60 | 5 | 92.0 | 0.04 |
| 16 | 35 | 50 | 15 | 93.3 | 0.03 |
| 17 | 35 | 40 | 25 | 94.2 | 0.02 |
| 18 | 35 | 30 | 35 | 93.3 | 0.03 |
| 19 | 35 | 25 | 40 | 92.4 | 0.04 |
| 20 | 35 | 15 | 50 | 85.0 | 0.25 |
| 21 | 15 | 60 | 25 | 91.1 | 0.05 |
| 22 | 15 | 50 | 35 | 93.1 | 0.03 |
| 23 | 15 | 45 | 40 | 91.8 | 0.05 |
| 24 | 10 | 70 | 20 | 86.6 | 0.13 |
| 25 | 10 | 60 | 30 | 91.9 | 0.05 |
| 26 | 10 | 50 | 40 | 92.5 | 0.05 |
| 27 | 10 | 40 | 50 | 90.4 | 0.05 |
| 28 | 5 | 60 | 35 | 82.3 | 0.20 |

As seen in Table 3, relatively excellent characteristics were obtained in the case where CuO was not less than 10 mass % and not more than 90 mass %, $TiO_2$ was not less than 5 mass % and not more than 60 mass %, and $Ag_2O$ was not less than 5 mass % and not more than 40 mass %. Significant densification and a relatively low dielectric loss were achieved particularly when CuO was not less than 15 mass % and not more than 75 mass %, $TiO_2$ was not less than 10 mass % and not more than 50 mass %, and $Ag_2O$ was not less than 15 mass % and not more than 35 mass %.

Example 4

A powder obtained by preliminarily mixing powders of $Nb_2O_5$, CuO, $TiO_2$, and $Ag_2O$ at a ratio by mass of 5.5:2.7:0.9:0.9 was prepared. This powder, alumina powder, and $Mn_3O_4$ powder were mixed by ball mill mixing so as to have a mixture ratio shown in Table 4 as to each sample, and the mixture was calcined for two hours at 600° C. Thereafter, it was pulverized in a ball mill again, and a sintered body was prepared by sintering the pulverized material at 900° C. or 950° C. for two hours in the same manner as that in Example 1, so that its relative sintered density was determined. Further, the heat conductivities of sintered body samples having relative densities exceeding 90% were measured by laser flashing. Further, gold electrodes were formed by sputtering, and dielectric characteristics were evaluated. The results are shown in Table 4.

TABLE 4

| Sample No. | Composition (wt %) | | | Relative Density | | Dielectric Loss | | Heat Conductivity | |
|---|---|---|---|---|---|---|---|---|---|
| | $Al_2O_3$ | Additive | $Mn_3O_4$ | 900° C. | 950° C. | 900° C. | 950° C. | 900° C. | 950° C. |
| 1 | 100 | 0 | 0 | 55.0 | 55.2 | — | — | — | — |
| 2 | 99 | 1 | 0 | 64.2 | 77.5 | — | — | — | — |
| 3 | 98 | 2 | 0 | 81.5 | 90.8 | — | 0.04 | — | 10.2 |

TABLE 4-continued

| Sample No. | Composition (wt %) | | | Relative Density | | Dielectric Loss | | Heat Conductivity | |
|---|---|---|---|---|---|---|---|---|---|
| | $Al_2O_3$ | Additive | $Mn_3O_4$ | 900° C. | 950° C. | 900° C. | 950° C. | 900° C. | 950° C. |
| 4 | 97 | 3 | 0 | 90.8 | 95.9 | 0.05 | 0.02 | 11.0 | 15.7 |
| 5 | 96 | 4 | 0 | 93.2 | 97.4 | 0.02 | 0.01 | 13.9 | 18.1 |
| 6 | 94 | 6 | 0 | 95.9 | 99.6 | 0.01 | 0.007 | 16.5 | 19.8 |
| 7 | 92 | 8 | 0 | 97.8 | 99.7 | 0.007 | 0.005 | 17.5 | 18.6 |
| 8 | 92 | 8 | 0.1 | 97.7 | 99.7 | 0.004 | 0.003 | 17.4 | 18.4 |
| 9 | 92 | 8 | 0.5 | 95.4 | 99.6 | 0.003 | 0.002 | 17.3 | 17.9 |
| 10 | 92 | 8 | 1.0 | 93.3 | 98.3 | 0.002 | 0.002 | 15.2 | 16.5 |
| 11 | 92 | 8 | 2.0 | 91.6 | 96.8 | 0.003 | 0.003 | 10.0 | 12.4 |
| 12 | 92 | 8 | 3.0 | 80.2 | 88.1 | 0.07 | 0.06 | — | — |
| 13 | 90 | 10 | 0 | 99.0 | 99.8 | 0.01 | 0.008 | 14.3 | 15.3 |
| 14 | 85 | 15 | 0 | 98.3 | 98.4 | 0.03 | 0.01 | 11.2 | 13.5 |
| 15 | 80 | 20 | 0 | 97.4 | 95.5 | 0.04 | 0.05 | 7.8 | 7.2 |
| 16 | 75 | 25 | 0 | 95.1 | 93.2 | 0.11 | 0.12 | 4.9 | 4.4 |

As seen in Table 4, when the content of $Al_2O_3$ exceeded 98%, a sufficient sinterability was not achieved, even with a composite additive added thereto. On the other hand, when the content of $Al_2O_3$ was less than 80%, a high sinterability was achieved, and both of the dielectric characteristic and the heat conductivity decreased. Therefore, the content of $Al_2O_3$ preferably is not less than 80% and not more than 98%, more preferably not less than 85% and not more than 96%.

Next, in the case where the ratio of $Al_2O_3$ and the composite additive was fixed so as to be 92%:8% and $Mn_3O_4$ further was added thereto, a tendency to improve the dielectric characteristic due to this addition was observed, but an increase in an added amount decreased the sintered density. Therefore, it is desirable that not less than 0.1 mass % and not more than 2 mass % of $Mn_3O_4$ is contained.

Apart from the present example, the inventors of the present invention made experiments in the same manner by varying the ratio of $Nb_2O_5$, CuO, $TiO_2$, and $Ag_2O$ in the composite additive and by using CuO-based, $TiO_2$-based, and $Ag_2O$-based composite additives, and consequently, similar results were obtained as to the content of $Al_2O_3$ and the addition of $Mn_3O_4$. Example 5

In the same manner as that of Example 1, powders of $Al_2O_3$, $Nb_2O_5$, CuO, $TiO_2$, and $Ag_2O$ were mixed at a ratio by mass of 93:3:2:1.5:0.5 by ball mill mixing. The obtained mixture was calcined for two hours at 600° C., and thereafter, it was pulverized in a ball mill again. Polyvinyl butyral resin and butyl acetate were added to the foregoing calcined powder and mixed so as to become in a slurry form, and was spread by the doctor blade method so as to have a sheet form on a base film (polyphenyl sulfide) to whose surface a releasing property was imparted.

For comparison, in the same manner as described above, a slurry was prepared by using only $Al_2O_3$ powder, and an alumina green sheet was prepared on a base film. Besides, a slurry was prepared in the same manner as described above using a powder containing 50 mass % of $Al_2O_3$ and 50 mass % of borosilicate lead glass, and a glass ceramic green sheet was prepared on a base film.

Next, an ethyl cellulose-based resin and terpineol were added appropriately to a powder of metallic silver, mixed and kneaded sufficiently by a three roll mill, whereby an Ag paste for internal layer wiring and an Ag paste for vias were prepared.

Next, φ 0.1 mm via holes were formed by punching at predetermined positions in the green sheet, and the conductive paste for vias was filled in the via holes in a necessary number of green sheets. Thereafter, a wiring pattern was formed on each sheet by screen-printing with the paste for internal layer wiring. The base films were removed and the green sheets were laminated, and the laminated sheets were subjected to thermocompression bonding at 80° C., whereby a laminate was obtained.

The laminate thus obtained was subjected to a binder removing process in a furnace, in normal atmosphere at 600° C., and was sintered at 920° C. for two hours. Separately from these, a sintered body was prepared using a laminate that did not contain Ag conductive bodies, so that it was used for heat conductivity measurement.

First, the heat conductivities of the laminates that did not contain a conductive body were measured. As a result, the laminate of the present invention had a heat conductivity of 18 W/m·k, while the laminate containing glass ceramic had a heat conductivity of 2.5 W/m·k. The laminate employing alumina had so small a mechanical strength that it was not subjected to this measurement. Therefore, a laminate employing alumina was formed by setting the sintering temperature to 1500° C., and its heat conductivity was determined to be 22 W/m·k.

Still further, measurement of a three-point transverse strength was carried out on the laminates that did not contain a conductive body, and that of the laminate of the present example was determined to be 380 MPa, while that of the laminate containing glass ceramic was determined to be 230 MPa. The laminate employing alumina had so small a mechanical strength that it was not subjected to this measurement. Therefore, a laminate employing alumina was formed by setting the sintering temperature to 1500° C., and its three-point transverse strength was determined to be 400 MPa. Therefore, the laminate of the present example, which was sintered at 920° C., exhibited a mechanical strength at the same level as that of the laminate employing alumina, which was sintered at 1500° C.

Next, continuation between the internal layer wiring and the via conductive body was evaluated as to the laminates containing the Ag conductive body. The laminate of the present invention and the laminate employing glass ceramic exhibited continuation, whereas the laminate employing alumina alone had so small a mechanical strength that it was not subjected to this measurement. Therefore, a laminate employing alumina was formed by setting the sintering temperature to 1500° C., but Ag electrodes therein were molten, and continuation was not obtained.

Then, power amplifier ICs were mounted on the laminate of the present invention and the laminate employing glass ceramic, and were operated. As a result, the laminate employing glass ceramic exhibited a significant temperature rise since heat radiation was insufficient due to its low heat conductivity, whereas the laminate of the present invention exhibited a smaller temperature rise.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An oxide ceramic material comprising aluminum oxide as a principal component, and at least one selected from A and B shown below as an auxiliary component:
    A: niobium oxide and copper oxide,
    B: copper oxide, titanium oxide, and silver oxide,
    wherein the oxide ceramic material is sintered at a temperature of not higher than 950° C. so as to have a relative density of not less than 90%.

2. The oxide ceramic material according to claim 1, wherein
    a content of the principal component in the entirety of the oxides is not less than 80 mass % and not more than 98 mass %, and
    in the case where all the rest of the components are the foregoing auxiliary components, a content of the auxiliary components is not less than 2 mass % and not more than 20 mass %, or in the case where other third components are contained in additional to the foregoing auxiliary components, a content of a sum of the auxiliary components and the third components is not less than 2 mass % and not more than 20 mass %.

3. The oxide ceramic material according to claim 1, wherein in the case where the auxiliary components are those of A, assuming an entirety of a sum of the auxiliary components is 100 mass %, percentages of niobium and copper oxide are in the following ranges, respectively:
    40 mass %≦niobium oxide≦70 mass %
    30 mass %≦copper oxide≦60 mass %.

4. The oxide ceramic material according to claim 1, further comprising at least one selected from titanium oxide, silver oxide, and bismuth oxide, in the case where the auxiliary components are those of A.

5. The oxide ceramic material according to claim 4, wherein, assuming that an entirety of a sum of the auxiliary components is 100 mass %, percentages of niobium oxide, copper oxide, titanium oxide, silver oxide, and bismuth oxide are in the following ranges:
    30 mass %≦niobium oxide≦70 mass %
    10 mass %≦copper oxide≦60 mass %;
    0 mass %≦titanium oxide≦30 mass %;
    0 mass %≦silver oxide≦30 mass %;
    0 mass %≦bismuth oxide≦40 mass %.

6. The oxide ceramic material according to claim 1, wherein, in the case where the auxiliary components are those of B, assuming that an entirety of a sum of the auxiliary components is 100 mass %, percentages of copper oxide, titanium oxide, and silver oxide are in the following ranges, respectively:
    10 mass %≦copper oxide≦90 mass %;
    5 mass %≦titanium oxide≦60 mass %;
    5 mass %≦silver oxide≦40 mass %.

7. The oxide ceramic material according to claim 1, further containing 0.1 mass % to 2.0 mass % of manganese oxide with respect to an entirety of the oxides assumed as 100 mass %.

8. The oxide ceramic material according to claim 1, wherein the oxide ceramic material has a heat conductivity of not less than 5 W/m*k.

9. The oxide ceramic material according to claim 1, wherein the oxide ceramic material has a heat conductivity of not less than 10 W/m*k.

10. The oxide ceramic material according to claim 1, wherein the oxide ceramic material has a dielectric loss at 1 MHz of not more than 0.05.

11. The oxide ceramic material according to claim 1, wherein the oxide ceramic material has a dielectric loss at 1 MHz of not more than 0.01.

12. The oxide ceramic material according to claim 1, wherein the oxide ceramic material is obtained by mixing particles of either a metal material or a metal oxide material, molding the same, and sintering the same at a temperature of not higher than 950° C.

13. The oxide ceramic material according to claim 1, wherein the oxide ceramic material is obtained by mixing particles of either a metal material or a metal oxide material, then calcining and pulverizing the same, and thereafter, molding the same, and sintering the same at a temperature of not higher than 950° C.

14. A ceramic substrate comprising, at least in an internal layer:
    an insulation layer made of an oxide ceramic material,
        the oxide ceramic material containing aluminum oxide as a principal component, and at least one selected from at least A and B shown below as an auxiliary component:
        A: niobium oxide and copper oxide
        B: copper oxide, titanium oxide, and silver oxide; and
    a conductive body containing silver as a principal component.

15. A ceramic laminate device comprising, at least in an internal layer:
    an insulation layer made of an oxide ceramic material,
        the oxide ceramic material containing aluminum oxide as a principal component, and at least one selected from at least A and B shown below as an auxiliary component:
        A: niobium oxide and copper oxide
        B: copper oxide, titanium oxide, and silver oxide; and
    a conductive body containing silver as a principal component.

16. A power amplifier module comprising a ceramic substrate or a ceramic laminate device, and a power amplifier element mounted thereon,
    wherein the ceramic substrate or the ceramic laminate device includes, at least in an internal layer:
        an insulation layer made of an oxide ceramic material,
            the oxide ceramic material containing aluminum oxide as a principal component, and at least one selected from at least A and B shown below as an auxiliary component:
            A: niobium oxide and copper oxide
            B: copper oxide, titanium oxide, and silver oxide; and
        a conductive body containing silver as a principal component.

* * * * *